(12) United States Patent
Sun et al.

(10) Patent No.: US 10,853,537 B2
(45) Date of Patent: Dec. 1, 2020

(54) MODEL TEST SYSTEM FOR SEABED SEISMIC WAVE DETECTION AND METHOD THEREOF

(71) Applicant: PowerChina Huadong Engineering Corporation Limited, Hangzhou (CN)

(72) Inventors: Miaojun Sun, Hangzhou (CN); Zhigang Shan, Hangzhou (CN); Zengqing Guo, Hangzhou (CN); Mingyuan Wang, Hangzhou (CN)

(73) Assignee: PowerChina Huadong Engineering Corporation Limited, Hangzhou (CN)

( * ) Notice: Subject to any disclaimer, the term of this patent is extended or adjusted under 35 U.S.C. 154(b) by 517 days.

(21) Appl. No.: 15/669,856

(22) Filed: Aug. 4, 2017

(65) Prior Publication Data
US 2018/0101627 A1     Apr. 12, 2018

(30) Foreign Application Priority Data
Oct. 10, 2016   (CN) .......................... 2016 1 0882994

(51) Int. Cl.
*G06F 30/20*     (2020.01)
*G01V 1/00*     (2006.01)
(Continued)

(52) U.S. Cl.
CPC ................ *G06F 30/20* (2020.01); *G01V 1/00* (2013.01); *G01V 1/38* (2013.01); *G01V 99/005* (2013.01); *Y02A 90/36* (2018.01)

(58) Field of Classification Search
CPC ...... G06F 17/5009; G06F 30/20; G06F 30/25; G06F 30/27; G06F 30/28; G01V 1/00; G01V 1/38; G01V 99/005
(Continued)

(56) References Cited

U.S. PATENT DOCUMENTS

| | | | | |
|---|---|---|---|---|
| 6,024,344 A | * | 2/2000 | Buckley ............... | G01V 1/3852 181/110 |
| 2005/0259516 A1 | * | 11/2005 | Ray ..................... | G01V 1/3808 367/178 |

(Continued)

OTHER PUBLICATIONS

Jagadeesh et al. ("Directional Asymmetry in Random Waves Near Shallow Water Regions—Its Application in Physical Modelling", 8th International Conference on Asian and Pacific Coasts (APAC 2015), pp. 720-729) (Year: 2015).*

(Continued)

*Primary Examiner* — Iftekhar A Khan

(74) *Attorney, Agent, or Firm* — Wayne & Ken, LLC; Tony Hom

(57) ABSTRACT

The present invention discloses a model test system and method for seabed seismic wave detection. The model test system includes a model test unit which specifically includes a testbed for simulating a seabed, wherein a module for simulating bedrock and geology is arranged in the testbed; a water source supply unit supplies simulation seawater into the testbed; a sea wave generation apparatus is configured to act on the simulation seawater at different speeds and different forces to generate different sizes of sea waves. The present invention provides support and guidance for the advancing investigation of geologic parameters in a detection area such as distribution situations of faults, a range of landslides, a depth and morphology of a glide plane and the like.

8 Claims, 7 Drawing Sheets

(51) Int. Cl.
  *G01V 1/38* (2006.01)
  *G01V 99/00* (2009.01)
(58) Field of Classification Search
  USPC .................................................. 703/9
  See application file for complete search history.

(56) References Cited

U.S. PATENT DOCUMENTS

| | | | | |
|---|---|---|---|---|
| 2006/0159524 | A1* | 7/2006 | Thompson | B63G 8/00 405/190 |
| 2006/0245300 | A1* | 11/2006 | De Kok | G01V 1/16 367/15 |
| 2006/0256651 | A1* | 11/2006 | Sanders | G01V 1/02 367/15 |
| 2009/0238647 | A1* | 9/2009 | Delfino | G01V 1/047 405/172 |
| 2010/0149912 | A1* | 6/2010 | Yang | G01V 1/006 367/23 |
| 2010/0157727 | A1* | 6/2010 | Woodard, Jr. | B63C 11/52 367/15 |
| 2011/0273958 | A1* | 11/2011 | Xia | G01V 1/3817 367/21 |
| 2012/0294123 | A1* | 11/2012 | You | G01V 1/18 367/188 |
| 2012/0300582 | A1* | 11/2012 | Winter | G01S 3/8022 367/19 |
| 2013/0028047 | A1* | 1/2013 | Erofeev | G01V 1/247 367/20 |
| 2014/0198607 | A1* | 7/2014 | Etienne | G01V 1/3852 367/15 |
| 2014/0200818 | A1* | 7/2014 | Peng | G01V 1/364 702/17 |
| 2017/0017007 | A1* | 1/2017 | Woodward, Jr. | B63B 25/28 |
| 2017/0283180 | A1* | 10/2017 | Fyffe | G01V 1/3852 |
| 2018/0095189 | A1* | 4/2018 | Craft | G01V 1/364 |
| 2018/0306937 | A1* | 10/2018 | Bagaini | G01V 1/30 |
| 2018/0364385 | A1* | 12/2018 | Woodward | B63C 11/52 |

OTHER PUBLICATIONS

Mànuel et al. ("Ocean Bottom Seismometer: Design and Test of a Measurement System for Marine Seismology" Sensors 2012, 12, 3693-3719). (Year: 2012).*

Berger et al. (An ocean bottom seismic observatory with near real-time telemetry, AGU publications, 2016, pp. 68-77) (Year: 2016).*

Michael J. Briggs (Basics of Physical Modeling in Coastal and Hydraulic Engineering, ERDC/CHL CHETN-XIII-3, 2013, pp. 1-11) (Year: 2013).*

Jagadeesh et al. ("Directional Asymmetry in Random Waves Near Shallow Water Regions—Its Application in Physical Modelling", Procedia Engineering 116 ( 2015 ) 720-729) (Year: 2015).*

Mànuel et al. ("Ocean Bottom Seismometer: Design and Test of a Measurement System for Marine Seismology", Sensors 2012, pp. 3693-3719) (Year: 2012).*

Løseth et al. ("A scaled experiment for the verification of the SeaBed Logging method" Journal of Applied Geophysics 64 (2008) 47-55) (Year: 2008).*

Tsuboi et al. ("Modeling of global seismic wave propagation on the Earth Simulator", Journal of the Earth Simulator, vol. 1, Apr. 2004, 57-66) (Year: 2004).*

* cited by examiner

MODEL TEST SYSTEM FOR SEABED SEISMIC WAVE DETECTION AND METHOD THEREOF

TECHNICAL FIELD

The present invention relates to a model test system and method for seabed seismic wave detection.

BACKGROUND

The offshore is the earliest and most frequent zone for the development and utilization of marine activities. At present, how to effectively protect, reasonably utilize and develop the ocean is a research hot spot of various countries in the world. China is a major maritime country with rich ocean resources, and the reasonable development and utilization of the ocean resources can facilitate the rapid development of economy in China. In recent years, with the improvement of the development level of the ocean resource, the construction scale of the ocean engineering in China is larger and larger, the structure is more and more complicated, and requirements for the engineering construction are higher and higher; and more particularly, construction projects such as ports, coastal power plants, cross-sea bridges and tunnels, marine petroleum platform engineering and the like have high requirements for the exploration of undulation morphology of bedrock surfaces and special geologic phenomena such as submerged reefs, deep weathered rock troughs, seabed faults, seabed landslides and the like, and requirements for the stratum penetration depth are higher and higher. The coastal seabed fault detection and the seabed landslide detection can efficiently ensure early exploration of the coastal engineering construction (ports, coastal power plants, cross-sea bridge and tunnel engineering and the like). The advancing investigation of geologic parameters in a detection area such as distribution situations of faults, a range of landslides, a depth and morphology of a glide plane and the like can provide support and guidance and can provide a basis for site selection of the engineering construction as well as countermeasures and disposal measures of engineering geological problems in a construction period.

A seismic wave exploration technological method is one of the most common methods in sea shallow geology and structure detection. In order to optimize an ocean observation mode and research imaging features of the seabed geology, it is necessary to adopt an effective numerical simulation and physical simulation test. Relative to the numerical test, the physical model test is more approximate to a site real complicated environment, and a simulation result can effectively guide the real detection interpretation and technological improvement. However, research personnel make considerable researches on the aspect of the numerical simulation, but there are fewer experts to perform an indoor physical model test. The existing physical model test has the following problems:

1. A physical model test system is too large or too small. If the physical model test system is too large, excessive similar materials are required to fill; after one geologic detection simulation is completed, a large number of manpower and material resources are needed to replace the geologic form, thereby wasting time and labor; and if the physical model test system is too small, the similarity is great; the simulation result is quite different from a real site environmental detection result; and the research result cannot be used to directly guide the site detection. It is urgent to propose a physical model test system with moderate similarity and capable of really simulating the site geologic environment.

2. The geologic simulation working condition is single. The existing geological model test system generally performs the physical simulation research for one working condition. A geologic body in the geological model test system cannot be replaced, and the geological form cannot be rapidly changed according to the site environment. Due to the monotony of the simulation geology, the model test system cannot be reused, thereby greatly wasting the resource. It is urgent to propose a model test system capable of simulating various working conditions, capable of changing the geologic form according to the geologic environment and capable of being reused.

3. The existing physical model test system lacks of analysis on a sea wave influence. The existing test system performs the test generally in stable water, and the water surface is stable, but in a real site environment, the sea waves can influence the seismic wave propagation to a certain extent. In the presence of the sea waves, the sea level is a surface with free fluctuation, and the reflection of the seismic wave at the interface is complicated; and meanwhile, since a seismic focus and an observation mode are arranged generally in a towing rope manner, when the sea wave is large, the depth of a towing rope in the seawater is changed, which influences the acquired seismic wave data.

4. The layout of an observation system is limited. Limited by the model test system, an observation mode of a seismic exploration system is generally fixedly installed, so that rapid combination of different observation modes cannot be realized according to the requirements, greatly reducing the research of different observation modes; and therefore, it is urgent to propose an automatic control system capable of realizing the rapid combination of the observation system so as to increase the physical model test efficiency.

SUMMARY OF THE INVENTION

In order to solve the above-mentioned problems, the present invention proposes a model test system and method for seabed seismic wave detection; and the present invention can research imaging features of the coastal geologic bodies and optimize an observation mode, can better guide the site exploration work, can provide support and guidance for advancing exploration of the distribution situation of faults in a detection area and geological parameters such as a landslide scope, a depth and morphology of a glide plane and the like, and can provide evidences for site selection of engineering construction as well as countermeasures and disposal measures for engineering geological problems in a construction period.

In order to achieve the above-mentioned objective, the present invention adopts a technical solution as follows:

A model test system for seabed seismic wave detection includes a central control unit, a sea wave generation apparatus, a model test unit, an observation system and a water source supply unit, wherein the model test unit includes a testbed for simulating a seabed, a module for simulating bedrock and geology is arranged in the testbed, the water source supply unit supplies simulation seawater into the testbed, and the sea wave generation apparatus is configured to act on the simulation seawater at different speeds and different forces to generate sea waves of different sizes.

The upper end of the testbed is provided with the observation system, and the testbed specifically includes a seismic focus control unit configured to stimulate seismic waves at different depths in the water and a detector control unit covering the upper end of the testbed and performing total-space acquisition for the waves in different directions.

The central control unit controls working states of the sea wave generation apparatus, the water source supply unit and the observation system.

The model test unit includes a testbed, a seawater detection unit is arranged in the testbed, fixed bedrock modules and a detachable geologic module are configured in the testbed, two fixed bedrock modules are respectively fixed at the end part of the testbed, and the detachable geologic module is movably connected with the interior of the testbed through a chute at the bottom end.

Interfaces between the fixed bedrock modules and the detachable geologic module are coupled by virtue of butter.

The testbed includes a steel framework and organic glass arranged on the framework and forming a carrier body, and the organic glass is sealed through a sealant.

The detachable geologic module is a fault geologic module, the fault geologic module includes geologic module slide rails, a fault body and bedrock, the bottom end of the bedrock is provided with the geologic module slide rails and the middle end of the bedrock is provided with the fault body, wherein the fault body is set as different dip angles and thicknesses.

The detachable geologic module is a landslide geologic module and includes slide rails, a landslide body and bedrock, the bottom end of the bedrock is provided with the slide rails, the upper end is provided with the landslide body, and the landslide body is set as different scales, different sizes and/or different thicknesses.

The seawater detection unit includes a water level indicator, a water thermometer and a water flow meter which are respectively used to detect a water filling degree, a water temperature and a water flow rate in the testbed.

The sea wave generation apparatus includes an electric box, an electric pushing rod and a pushing plate, and the power of the electric box is adjusted through the central control unit to change a pushing speed of the pushing rod driven by the electric box, so that the pushing plate generates sea waves of different sizes according to different speeds and different forces acting on the water.

The seismic focus control unit includes main slide tracks, slide foundation supports, seismic focus slide rods, a slide ring, a transducer, a seismic focus contraction rod and a transmission cable, wherein the two main slide tracks are respectively installed at two upper ends of the testbed, the two main slide tracks are respectively provided with the slide foundation supports, the seismic focus slide rods are fixedly installed on the two slide foundation supports, a slide position of each slide foundation support on the main slide track is adjustable, the seismic focus slide rod is movably sleeved with the slide ring, and the slide ring is connected with the transducer so as to realize the distribution of seismic focus points in a two-dimensional planar space.

The transducer is fixed on the slide ring through a telescopic rod, the transducer is used as a seismic focus, and the stimulation of seismic waves at different underwater depths is realized by controlling different lengths of the telescopic rod.

The detector control unit includes two slide rails, the two slide rails are perpendicularly fixed on the two main slide tracks through the slide foundation supports, a plurality of slide rods are arranged between the two slide rails, each slide rod is provided with a plurality of detectors, the wave detectors are connected with a wireless base station through a cable, and signals acquired by different detectors are transmitted to the wireless base station in real time through the cable.

Each slide rod is a telescopic rod, and the full coverage of the detectors in a planar space above the testbed is realized by controlling the length of the telescopic rod and the distribution of the detectors.

The water source supply unit includes a bidirectional water pump, a water pipe, a filter nozzle, a filter net, a sludge removal hole and a water collection tank, the water pump is installed between the testbed and the water collection tank, the water pipe is fixed in the testbed, the filter nozzle is installed at the bottom of the water pipe, and the sludge removal hole and the filter net are arranged in the water collection tank. A part of large particle substances can be filtered through the filter nozzle, so that large-sized blocks of geologic similar materials are prevented from entering the water pipe and damaging the water source supply unit.

A method based on the above model test system includes the following steps:

(1) investigating a coastal engineering geologic site, designing morphological features, seawater elevation and sizes of sea waves of a geologic body in a coastal exploration environment according to physical simulation requirements, and calculating relevant parameters of similar materials required for obtaining a physical model test system through a similarity ratio;

(2) producing a detachable geologic model according to relevant parameters of the similar materials, fixing the detachable geologic model in a testbed, and quickly installing the produced detachable model between two fixed bedrocks by applying an appropriate force to one side;

(3) enabling a water source supply unit to supply water into the testbed until reaching a set water level;

(4) controlling a seismic focus unit and a detector unit on main slide tracks, enabling a seismic focus to be disposed at a position in a designed space, also controlling a detector slide rod to move to a position a set test line, manually shifting a slide ring on the detector slide rod, and enabling each detector to be disposed at different measuring points;

(5) controlling a seismic focus telescopic rod and different seismic focus telescopic rods to obtain different lengths of the telescopic rods, and placing the seismic focus telescopic rod in the water at different depths;

(6) controlling the generation of sea waves, regulating and controlling a propelling speed, monitoring a sea wave value through a water flow meter and a water level indicator, and after reaching a designed value, setting a constant circulating propelling speed of a motor; and (7) switching on each wireless base station, controlling a transducer to transmit acoustic signals of different frequencies through the central control unit, acquiring the acoustic signals at different positions in real time through a detector installed at the rear side, transmitting the signal data to the central control unit through an integrated cable for real-time display and storage.

Different seismic wave data can be acquired by changing the position of the seismic focus.

After the test is completed, water in the model is pumped into the water collection tank, and all systems are switched off.

Sludge in the water collection tank is regularly removed. A sludge removal hole is installed at the bottom of the water collection tank. When the water in the water collection tank is almost pumped into the model, the sludge removal hole can be opened, and silt and sludge deposited on the bottom of the water collection tank are removed by adopting a small hook or a small shovel, to ensure that the water for circulation at every time is a clear and clean water source.

A working principle of the present invention is as follows: the test system can realize the seismic exploration simulation of the coastal geology, and the morphology and features of the seabed geologic body can be replaced as required according to the requirements by changing different geologic model blocks. Meanwhile, by adopting an automatic observation mode control system, various combination modes and rapid automatic layout of the observation system can be realized. Furthermore, by arranging the sea wave generation system, the height and degree of the sea waves can be changed in real time, so that real simulation of an ocean seismic exploration environment can be realized. The physical model test system can research the imaging features of the coastal geologic bodies and optimize the observation mode, can better guide the site exploration work, can provide support and guidance for advancing exploration of the distribution situation of faults in a detection area and geological parameters such as a landslide scope, a depth and morphology of a glide plane and the like, and can provide a basis for site selection of engineering construction as well as countermeasures and disposal measures for engineering geological problems in a construction period.

The present invention has the beneficial effects as follows.

(1) The present invention proposes the model test system and method for seabed seismic wave detection. The model test system includes the central control unit, the coastal geologic model body, the sea wave generation apparatus, the observation system automatic layout system and the seawater control system. Site environmental factors are sufficiently considered, various simulations of various site geologies can be realized, the seismic wave detection environmental influencing factors of different geologies and different environments can be researched, the imaging features can be analyzed, and the observation mode can be optimized, thereby providing guidance for site exploration.

(2) The present invention proposes a quick installation method of a coastal geologic model. An installation hole is reserved at one side of a model frame, a part of geologic bodies of the geologic model can be taken out, and the prefabricated model blocks can be installed into the model through the slide rails. The method can maximally reduce variables of the model geologic body without replacing the integral material, thereby saving the test cost, and increasing the operation efficiency. Meanwhile, boundaries of the model blocks are set as perpendicular angles and coupled by adopting butter with high viscosity, thereby maximally reducing the influence of a contact seam on the seismic wave propagation.

(3) The present invention proposes a sea wave generation apparatus and a seawater control system. Through the seawater control system, the water in the model system can be pumped into the water collection tank, and the water in the water tank can also be reversely pumped into the model test system to perform the test according to test requirements, thereby avoiding the waste of water resources; and meanwhile, the sea wave generation apparatus is simple in structure and low in cost and can be used for generating the ocean waves so as to really simulate the site complicated environment.

(4) The present invention proposes an observation mode semi-automatic layout system. Through the central control unit, the detectors can be moved at different positions on the slide rails above the model system, so that test lines are distributed as needed; and meanwhile, the depth of each detector and seismic focus disposed in the water can be controlled through the telescopic rods, and the model observation test at different space positions and under multiple observation mode combinations can be realized.

BRIEF DESCRIPTION OF THE DRAWINGS

FIG. 3($b$) is a schematic diagram of a landslide geologic module of the present invention;

FIG. 5($b$) is a schematic diagram of a detector apparatus of the present invention.

In the figures, 1: model frame base; 2: fixed bedrock module; 3: detachable geologic module; 4: fault geologic module; 5: landslide geologic module; 6: geologic module slide rail; 7: fault; 8: landslide body; 9: geologic module chute; 10: sea wave generation motor box; 11: pushing rod; 12: pushing plate; 13: bidirectional water pump; 14: water pipe; 15: filter nozzle; 16: filter net; 17: sludge removal hole; 18: main slide track; 19: slide foundation support; 20: seismic focus slide rod; 21: detector slide track 22: slide ring; 23: detector slide rod; 24: detector; 25: wireless base station; 26: transducer; 27: seismic focus contraction rod; 28: transmission cable; 29: seawater detection unit; 30: water collection tank

DETAILED DESCRIPTION OF THE INVENTION

The present invention is further described below in combination with drawings and embodiments.

Figure 1:
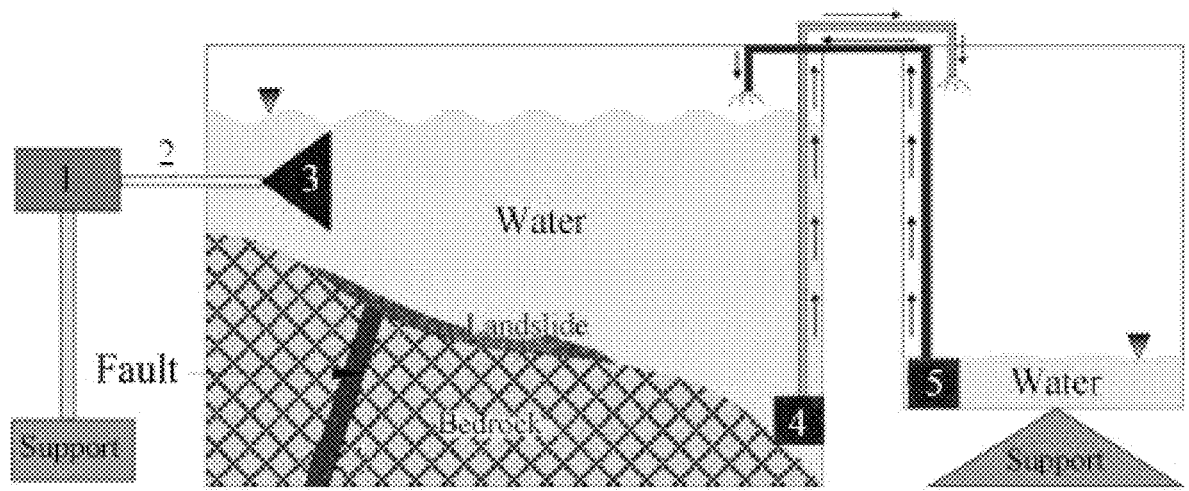
FIG. 1 is a schematic diagram of the present invention.

A model test system for seabed seismic wave detection is provided. A principle of the model test system for seabed seismic wave detection is shown in FIG. 1. A wave generation system is arranged in the model to simulate sea waves, and a water collection apparatus is arranged to reuse a water source. An observation system can be arranged at different depths of the water so as to perform a detection test for a set seabed fault or a landslide body.

Figure 2:
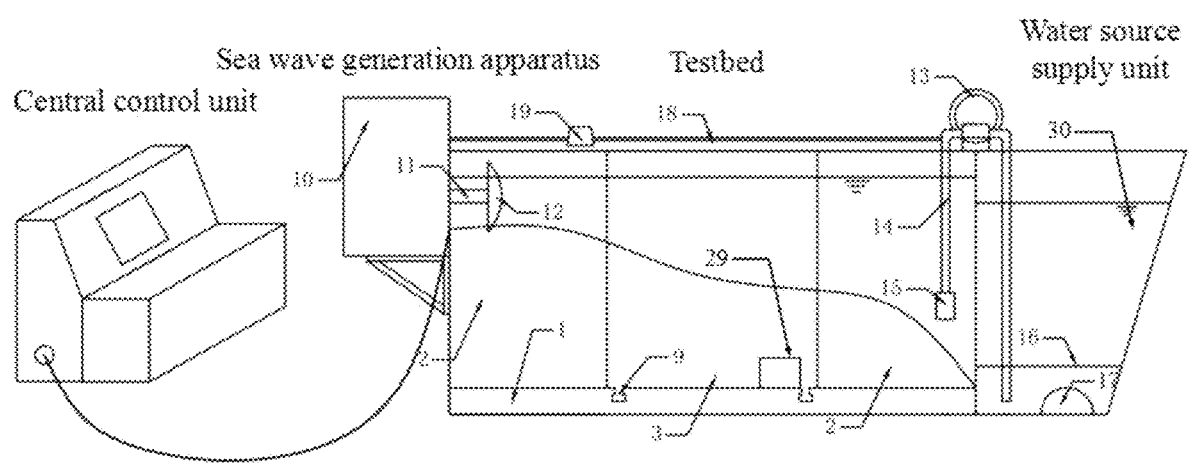
FIG. 2 is a system schematic diagram of the present invention.

A model test system for seabed seismic wave detection is provided. Constituent parts of the model test system for seabed seismic wave detection are shown in FIG. 2. The model test system for the seabed seismic wave detection includes a central control unit, a coastal geologic model body, a sea wave generation apparatus, an observation system automatic layout system and a seawater control system, wherein the central control unit is arranged in an independent control chamber and connected with the sea wave generation apparatus, the observation system automatic layout system and the seawater control system through a control cable. The operation of a plurality of systems and apparatuses can be completed through the central control unit.

The coastal geologic model body includes a physical testbed, a geologic body model block and a seawater monitoring system. The physical testbed is mainly made of steel material, an overall dimension of the model test system is 2 m*1 m*1 m, and the testbed adopts organic glass and a sealant as water barrier materials. The interior of a model frame is filled with two portions, i.e. a fixed bedrock module 2 and a detachable geologic module 3. A testbed base 1 is provided with two geologic module chutes 9, a geologic module slide rail 6 is arranged below the detachable geologic module 3, and the geologic module can be installed into the testbed through the chutes 9. Interfaces between the fixed bedrock module 2 and the detachable geologic module 3 are coupled by virtue of butter with high viscosity.

Figure 3A:
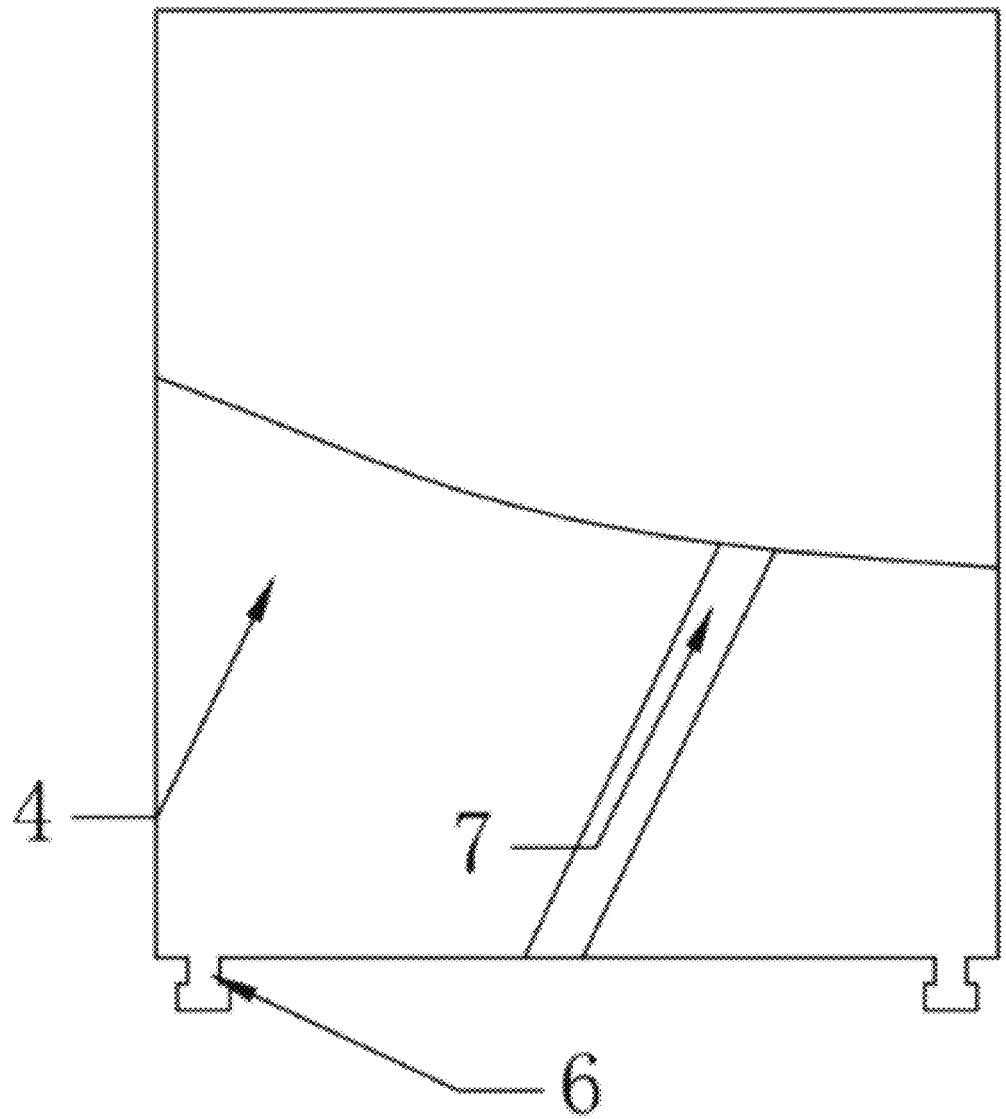
FIG. 3($a$) is a schematic diagram of a fault geologic module of the present invention.
Figure 3B:
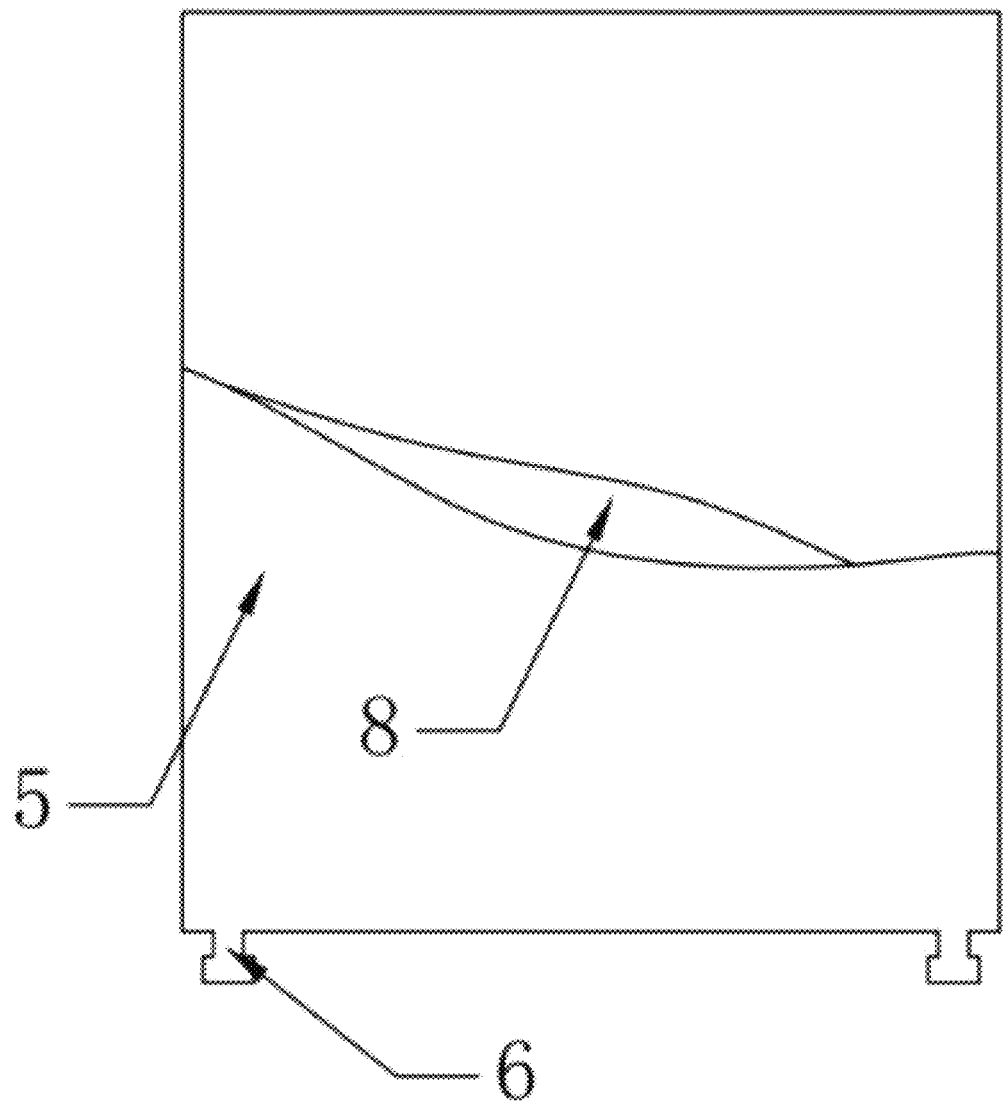

As shown in FIG. 3(a) and FIG. 3(b), the detachable geologic module 3 mainly can be classified into a fault geologic module 4 and a landslide geologic module 5. The fault geologic module 4 mainly consists of geologic module slide rails 6, a fault body 7 and bedrock, wherein the fault body can be set as different dip angles and different thicknesses; and the landslide geologic module 5 mainly consists of geologic module slide rails 6, a landslide body 8 and bedrock, wherein the landslide body can be set as different scales, different sizes and different thicknesses. The detachable geologic module can be formed by pouring similar materials, can be stored for a long time and can be reused and replaced for multiple times.

The seawater monitoring system includes various monitoring apparatuses such as a water level indicator, a water thermometer, a water flow meter and the like. The water level indicator is used for monitoring a filling water degree of the model system, the water thermometer is used for monitoring the temperature of the water, and the water flow meter is used for monitoring a water flow rate caused by the simulation sea waves. By monitoring the above three data, a water depth, water temperature and water flow rate of the test system can be controlled, and the influence of different parameters on the seabed geologic seismic exploration can be researched.

The sea wave generation apparatus consists of an electric box 10, an electric pushing rod 11 and a pushing plate 12, and the power of the electric box 10 is adjusted through the central control unit to change a pushing speed of the pushing rod 11, so that the pushing plate 12 generates sea waves of different sizes according to different speeds and different forces acting on the water.

Figure 4:
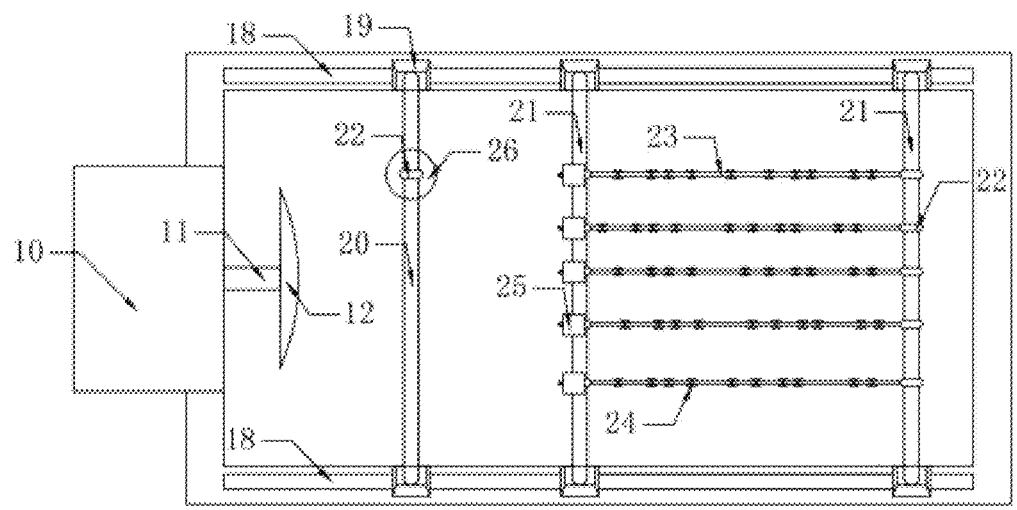
FIG. 4 is a schematic diagram of an automatic observation system of the present invention.

As shown in FIG. 4, the observation system automatic layout system includes a seismic focus control unit and a detector control unit. The seismic focus control unit consists of main slide tracks 18, slide foundation supports 19, a seismic focus slide rod 20, a slide ring 22, a transducer 26, a seismic focus contraction rod 27 and a transmission cable 28.

The main slide tracks 18 are installed above the testbed, the two slide tracks 18 are respectively provided with the slide foundation supports 19, and the seismic focus slide rod 20 is fixedly installed on the slide foundation supports 19. An inner diameter of the slide ring 22 is equal to or slightly greater than the diameter of the seismic focus slide rod 20, and the slide ring 22 is sleeved on the seismic focus slide rod 20. The slide position of the slide foundation support 19 on the slide rail 18 is controlled through an important control system, and the position of the slide ring 22 on the slide rod 20 is controlled, so that the distribution of seismic focus points in a two-dimensional planar space is realized.

Figure 5A:
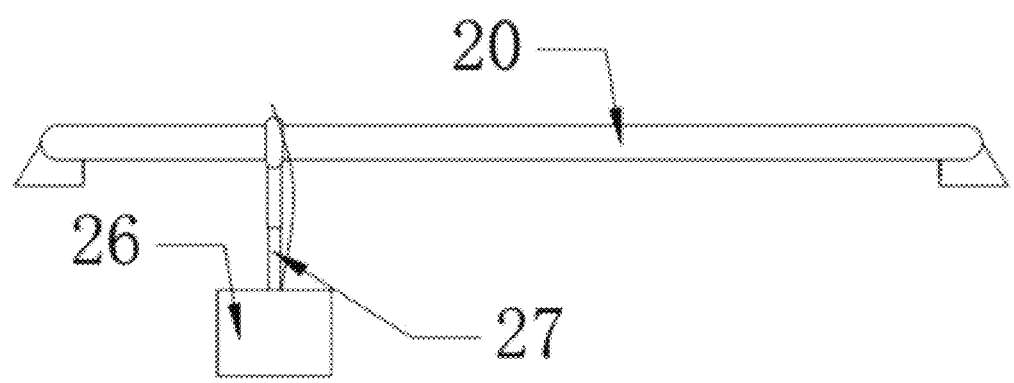
FIG. 5($a$) is a schematic diagram of a seismic focus apparatus of the present invention.
Figure 5B:
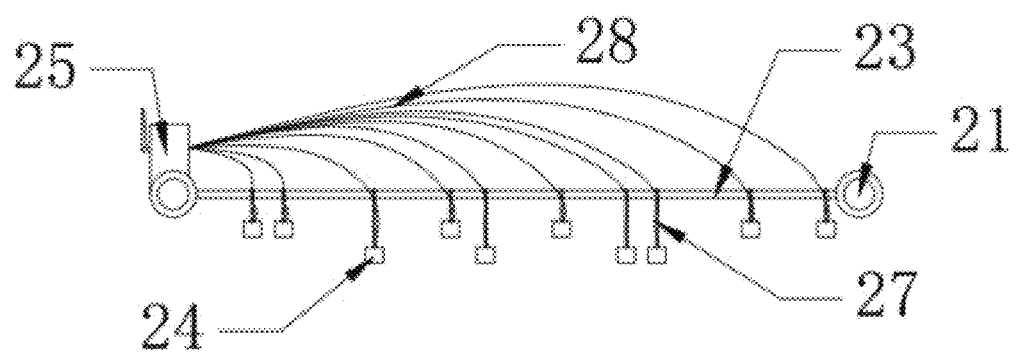

As shown in FIG. 5(a) and FIG. 5(b), the test system adopts the transducer 26 as a seismic focus, so that the transmission of seismic wave signals of different frequencies can be realized. The transducer 26 is fixedly connected with a tail portion of the seismic focus contraction rod 27. The seismic focus contraction rod 27 is divided into three sections in total, a telescopic function of the seismic focus contraction rod is realized by adopting a small-sized hydraulic apparatus, and the stimulation of seismic waves at different underwater depths can be realized by controlling different lengths of the telescopic rod according to test needs.

The transducer 26 is directly connected with the central control unit through a cable, and through the central control unit, the stimulation of the seismic wave signal can be remotely controlled while the three-dimensional space position of the seismic focus can be controlled in real time.

The detector unit mainly consists of main slide tracks 18, slide foundation supports 19, a detector slide track 21, detector slide rods 23, a slide ring 22, detectors 24, a wireless base station 25 and a transmission cable 28.

The detector slide tracks 21 are installed on the two slide foundation supports 19; four slide foundation supports 19 are respectively provided with two detector slide tracks 21 which are perpendicularly intersected with each other; five detector slide rods 23 are installed between the two slide tracks; each detector slide rod 23 is formed by a telescopic rod; a distance between the two detector slide tracks 21 can be increased or decreased through the central control unit; the detector slide rods 23 can also be stretched with the increase of the distance, and can be retracted with the decrease of the distance; a minimum length and a maximum length are respectively 80 cm and 150 cm; and the coverage in a planar space above the model system can be basically realized.

Each detector 24 is a three-component detector and can perform total-space acquisition for waves in different directions, thereby obtaining full wave field information under the model, and facilitating the processing and interpretation of the seismic data. The lower end of the telescopic rod 27 is fixedly provided with the three-component detector 24, the detector is connected with the wireless base station 25 through the cable 28, signals acquired by different detectors are transmitted to the wireless base station 25 in real time through the cable, every ten detectors share one wireless base station 25, and the wireless base station 25 transmits the acquired seismic wave signal to the central control unit in real time, thereby realizing the real-time view and storage of the data.

As shown in FIG. 2, the water source supply unit includes a bidirectional water pump 13, a water pipe 14, a filter nozzle 15, a filter net 16, a sludge removal hole 17 and a water collection tank. The water pump 13 is installed between the testbed and the control system. The filter nozzle 15 is installed at the bottom of the water pipe 14 in the testbed, and a part of large particle substances can be filtered through the filter nozzle, so that large-sized blocks of geologic similar materials are prevented from entering the water pipe and damaging the water source supply unit.

The filter net 16 is installed at the bottom in the water collection tank, and the water pump 13 pumps the water from the model and delivers the water into the water collection tank through the water pipe 14. With the increase of the water volume, the water level rises gradually, and the water gradually flows over the filter net 16. The filter net can filter tiny silt to enable the silt to be settled at the bottom of the water collection tank. When the model needs to be filled with water, the water pipe 14 is lifted upwards from the water collection tank until a head portion of the water pipe 14 is higher than the filter net 16; and then the water is pumped, so that the turbid silt water can be prevented from re-entering the model.

The sludge removal hole 17 is installed at the bottom of the water collection tank. When the water in the water collection tank is almost pumped into the model, the sludge removal hole 17 can be opened, and silt and sludge deposited on the bottom of the water collection tank are removed by adopting a small hook or a small shovel, so as to ensure the water for circulation at every time is a clear and clean water source.

A model test system and method for seabed seismic wave detection are provided. The method includes the following steps:

(1) investigating a coastal engineering geologic site, designing morphological features, seawater elevations and sizes of sea waves of geologic bodies in a coastal exploration environment according to physical simulation requirements (similarity ratio), and calculating relevant parameters of similar materials required for obtaining a physical model test system through a similarity ratio;

(2) producing a corresponding detachable geologic model according to the parameters of the similar materials obtained in step (1), and fixing the detachable geologic model on a geologic module slide rail 6;

(3) respectively coating butter having high viscosity as a coupling agent on interfaces of two sides of the produced detachable geologic model block, and withdrawing the detachable model block 3 in the model;

(4) aligning the geologic module slide rail 6 of the produced detachable model block with a chute 9 on a frame base of a physical model, and installing the produced detachable model block between two fixed bedrocks 2 by applying an appropriate force to one side;

(5) closing the model fixing frame, adhering a seam by adopting a sealant to ensure that the model is not pervious to water;

(6) controlling the seawater control system by the central control unit, to enable the bidirectional water pump 13 to begin to work, pumping the water source in the water collection tank into the testbed, and when a water level reaches a test designed value, switching off the water pump 13;

(7) quickly installing the detectors 24 and a seismic focus 26, controlling a seismic focus unit and a detector unit on main slide tracks 18 by the central control unit so that the seismic focus 26 is disposed at a position in a designed space, also controlling the detector slide rods 23 to move to a set position of a test line, and manually shifting the slide ring 22 on each detector slide rod, to enable each detector 24 to be disposed at different test point positions;

(8) controlling a seismic focus telescopic rod 27 and different seismic focus telescopic rods 27 through the central control unit to obtain different lengths of the telescopic rod, and placing the seismic focus telescopic rod at different depths in the water;

(9) switching on a sea wave generation apparatus, controlling a motor 10 through the central control unit, regulating and controlling a propelling speed of the motor, monitoring a wave value through a water flow meter and a water level indicator, and after reaching a designed value, setting a constant circulating propelling speed of the motor;

(10) switching on each wireless base station 25, controlling a transducer 26 to transmit acoustic signals of different frequencies by the central control unit, acquiring the acoustic signals at different positions in real time by the detector 24 installed at the rear side, and transmitting the signal data to the central control unit through an integrated cable 28 for real-time display and storage;

(11) after the step (10) is completed, performing the next seismic wave data acquisition by changing positions of the seismic focus according to the step (7) and the step (8);

(12) after the test is completed, pumping water in the model into the water collection tank, and switching off all systems; and

(13) regularly cleaning sludge in the water collection tank; installing a sludge removal hole 17 at the bottom of the water collection tank; when the water in the water collection tan is almost pumped into the model, opening the sludge removal hole 17, and removing silt and sludge deposited on the bottom of the water collection tank by adopting a small hook or a small shovel, so that the water for circulation at every time is ensured to be a clear and clean water source.

The above describes the specific embodiments of the present invention in combination with drawings rather than limiting a protection scope of the present invention. It shall be understood by those skilled in the art that on the basis of the technical solution of the present invention, various modifications or variations made by those skilled in the art without contributing creative work still fall within the protection scope of the present invention.

What is claimed is:

1. A model test system for seabed seismic wave detection, comprising: a central control unit, a sea wave generation apparatus, a model test unit, an observation system and a water source supply unit; wherein the model test unit comprises a testbed, wherein the testbed further comprises a simulating module configured to simulate a seabed, and a seawater detection unit, the water source supply unit supplies simulation seawater into the simulated seabed, and the sea wave generation apparatus is configured to generate sea waves of different sizes by exerting different forces on the simulation seawater;

an upper end of the testbed is provided with the observation system, and the testbed comprises a seismic focus control unit configured to stimulate seismic waves at different depths in the simulation seawater and a detector control unit covering on the upper end of the testbed, wherein the detector control unit is configured to acquire the seismic waves at different directions in a preset space; and the central control unit controls working states of the sea wave generation apparatus, the water source supply unit and the observation system, wherein the simulating module further comprises fixed bedrock modules and a detachable geologic module, the detachable geologic module is a landslide geologic module and comprises geologic module slide rails, a landslide body and bedrock, the bottom end of the bedrock is provided with the geologic module slide rails, the upper end is provided with the landslide body, and the landslide body is set as different scales, different sizes and/or different thicknesses.

2. The model test system for seabed seismic wave detection according to claim 1, wherein the fixed bedrock modules are fixed at an end part of the testbed, and the detachable geologic module is movably connected with the interior of the testbed through a chute at the bottom end.

3. The model test system for seabed seismic wave detection according to claim 1, wherein the detachable geologic module is a fault geologic module, the fault geologic module comprises geologic module slide rails, a fault body and bedrock, the bottom end of the bedrock is provided with the geologic module slide rails and the middle end of the bedrock is provided with the fault body, wherein the fault body is set as different dip angles and thicknesses.

4. The model test system for seabed seismic wave detection according to claim 1, wherein the seawater detection unit monitors simulation seawater level, simulation seawater temperature and simulation seawater flow velocity respectively.

5. The model test system for seabed seismic wave detection according to claim 1, wherein the sea wave generation apparatus comprises an electric box, an electric pushing rod and a pushing plate, and power of the electric box is adjusted through the central control unit to change a pushing speed of the electric pushing rod driven by the electric box, so that the pushing plate generates sea waves of different sizes according to different speeds and different forces acting on the simulation seawater.

6. The model test system for seabed seismic wave detection according to claim 1, wherein the seismic focus control unit comprises main slide tracks, slide foundation supports, seismic focus slide rods, a slide ring, a transducer, a seismic focus contraction rod and a transmission cable, wherein the main slide tracks are installed at upper ends of the testbed, the main slide tracks are provided with the slide foundation supports, the seismic focus slide rods are installed on the slide foundation supports, a slide position of each slide foundation support on the main slide track is adjustable, the seismic focus slide rods are movably sleeved with the slide ring, and the slide ring is connected with the transducer so as to realize distribution of seismic focus points in a two-dimensional planar space; the transducer is fixed on the slide ring through a telescopic rod, the transducer is used as a seismic focus, and the stimulation of seismic waves at different underwater depths is realized by controlling different lengths of the telescopic rod.

7. The model test system for seabed seismic wave detection according to claim 6, wherein the detector control unit comprises two slide rails, the two slide rails are perpendicularly fixed on the main slide tracks through the slide foundation supports, a plurality of detector slide rods are arranged between the two slide rails, each detector slide rod is provided with a plurality of detectors, the detectors are connected with a wireless base station through a cable, and signals acquired by different detectors are transmitted to the wireless base station in real time through the cable; and each detector slide rod is a telescopic rod, and full coverage of the detectors in a planar space above the testbed is realized by controlling length of the telescopic rod and the detectors.

8. The model test system for seabed seismic wave detection according to claim 1, wherein the water source supply unit comprises a bidirectional water pump, a water pipe, a filter nozzle, a filter net, a sludge removal hole and a water collection tank, the water pump is installed between the testbed and the water collection tank, the water pipe is fixed in the testbed, the filter nozzle is installed at the bottom of the water pipe, and the sludge removal hole and the filter net are arranged in the water collection tank.

* * * * *